(12) United States Patent
Goto et al.

(10) Patent No.: US 6,846,728 B2
(45) Date of Patent: Jan. 25, 2005

(54) SEMICONDUCTOR THIN FILM, SEMICONDUCTOR DEVICE EMPLOYING THE SAME, METHODS FOR MANUFACTURING THE SAME AND DEVICE FOR MANUFACTURING A SEMICONDUCTOR THIN FILM

(75) Inventors: Masashi Goto, Katano (JP); Mikihiko Nishitani, Nara (JP); Masaharu Terauchi, Shijonawate (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/379,539

(22) Filed: Mar. 6, 2003

(65) Prior Publication Data

US 2003/0162373 A1 Aug. 28, 2003

Related U.S. Application Data

(62) Division of application No. 09/658,667, filed on Sep. 8, 2000, now Pat. No. 6,548,380.

(30) Foreign Application Priority Data

| Sep. 8, 1999 | (JP) | 11-254308 |
| Feb. 21, 2000 | (JP) | 2000-042212 |
| Jul. 12, 2000 | (JP) | 2000-211011 |

(51) Int. Cl.[7] .......................... H01L 21/20; H01L 21/36
(52) U.S. Cl. .................. 438/485; 438/487; 438/488; 438/503
(58) Field of Search ................. 438/485, 487, 438/488, 503, 513, 798, 969

(56) References Cited

U.S. PATENT DOCUMENTS

| 4,759,947 A | 7/1988 | Ishihara et al. |
| 4,801,474 A | 1/1989 | Saitoh et al. |
| 4,870,030 A | 9/1989 | Markunas et al. |

(List continued on next page.)

FOREIGN PATENT DOCUMENTS

| JP | 05-315251 | 11/1993 |
| JP | 7-37808 | 2/1995 |
| JP | 08-250438 | 9/1996 |
| JP | 9-156916 | 6/1997 |
| JP | 9-251958 | 9/1997 |
| JP | 09-2725669 | 9/1997 |
| JP | 10-265212 | 6/1998 |
| JP | 11-074204 | 3/1999 |
| JP | 11-087751 | 3/1999 |
| JP | 11-140653 | 5/1999 |
| JP | 11-145062 | 5/1999 |

OTHER PUBLICATIONS

Sugai, Hideo. "Recent progress in low–pressure high–density plasmas—ECR, helicon–wave–excited and inductively coupled plasmas." 1994. pp. 559–567. *Oyo Buturi*, vol. 63, No. 6. English translation abstract.

Kitagawa et al., "Control of Crystallinity and Orientation of Microcrystalline Silicon Using in Situ RHEED Observation", 2000 IEEE, pp. 780–783.

Okamura (JP 10–265212) (Translation).

Murakami (JP 11–145062) (Translation).

*Primary Examiner*—Maria F. Guerrero
(74) *Attorney, Agent, or Firm*—Parkhurst & Wendel, L.L.P.

(57) ABSTRACT

By applying ion or optical energy or catalytic effects at the time of depositing a crystalline silicon thin film, improvements in crystallinity of the crystalline silicon thin film in proximities of an interface of a substrate or smoothing of its surface may be achieved. With this arrangement, it is possible to achieve improvements in crystallinity of the crystalline silicon film that is formed in a low temperature condition through CVD method and to prevent concaves and convexes from being formed on its surface or to prevent oxidation of grain fields, and it is accordingly possible to provide a thin film transistor, a semiconductor device such as a solar cell and methods for manufacturing these that exhibit superior characteristics and reliability.

2 Claims, 7 Drawing Sheets

U.S. PATENT DOCUMENTS

| | | |
|---|---|---|
| 5,016,563 A | 5/1991 | Murakami et al. |
| 5,324,553 A | 6/1994 | Ovshinsky et al. |
| 5,378,541 A | 1/1995 | Ihara et al. ................ 428/428 |
| 5,484,658 A | 1/1996 | Ihara et al. ................ 428/428 |
| 5,869,402 A | 2/1999 | Harafuji et al. |
| 6,013,544 A | 1/2000 | Makita et al. ............... 438/166 |
| 6,057,233 A | 5/2000 | Nakamura et al. |
| 6,165,876 A * | 12/2000 | Yamazaki et al. .......... 438/517 |
| 6,295,164 B1 * | 9/2001 | Murakami et al. .......... 359/584 |

* cited by examiner

SEMICONDUCTOR THIN FILM, SEMICONDUCTOR DEVICE EMPLOYING THE SAME, METHODS FOR MANUFACTURING THE SAME AND DEVICE FOR MANUFACTURING A SEMICONDUCTOR THIN FILM

This application is a Rule 1.53(b) Divisional Application of Ser. No. 09/658,667, filed Sep. 8, 2000, now U.S. Pat. No. 6,548,380.

BACKGROUND OF THE INVENTION (1) Field of the Invention

The present invention relates, among others, to a semiconductor thin film used as a semiconductor element, a method for manufacturing the same, and a thin film transistor employing the same.

(2) Description of the Prior Art

Amorphous silicon thin films are conventionally being employed as functional semiconductor thin films for use in thin film semiconductor devices such as thin film transistors or thin film solar batteries. Thin film transistors employing amorphous silicon films as active layers are being materialized as switching elements for driving pixels in liquid crystal display devices or the like, and solar batteries employing amorphous silicon films as photoelectric converting layers are being materialized in consumer-oriented fields such as watches/clocks or calculators.

Transistors that are employed in liquid crystal displays of active matrix type are, for instance, transistors for switching respective pixels or high-mobility transistors for peripheral circuits for sending control signals, which are based on image information to be displayed, to respective pixel transistors. Among these, it was conventionally the case that TFTs using amorphous silicon hydride (a-Si:H) as active layers in pixel transistors while these TFTs were manufactured through plasma chemical vapor deposition (PCVD).

While such a-Si:H TFTs are advantaged in that they may be manufactured at a temperature of approximately 300° C. in which light-transmitting glass substrates of low costs are well applicable, drawbacks are presented in that the mobility of n-type TFTs will be small ranging around 1 $cm^2$/Vs while no practical mobility can be achieved in case of p-type TFTs so that such TFTs are not applicable to peripheral circuits. Thus, peripheral circuits were arranged by mounting IC chips onto substrates.

On the other hand, TFTs employing polycrystalline silicon (poly-Si) as active layers are advantaged in that these TFTs exhibit high mobility for both, n-type and p-type ones and that they are applicable also to peripheral circuits. However, when using poly-Si, it is necessary to form films through reduced-pressure CVD methods in which processes need to be performed in high-temperature conditions of not less than 600° C. and thus to present a drawback that glass substrates of low costs could not be used.

Active research and developments related to techniques of manufacturing poly-Si (low temperature poly-Si) at low temperature in which glass substrates of low costs applicable are being made and materialized. One exemplary method is a method for manufacturing a polycrystalline film in which excimer laser beams with wavelengths existing in ultraviolet regions that are extremely highly absorbed by a-Si:H films are being irradiated onto a-Si:H films in a pulse-like manner for rapidly performing heat-melting and cooling of the a-Si:H film to achieve recrystallization (see Japanese Patent No. 2725669 and others). While this method enables it to form TFTs of high mobility at low temperature of not more than 600° C. in which glass substrates are applicable, drawbacks of this method reside in the fact that it is difficult to form poly-Si films of large areas owing to the fact of utilizing laser beams, and that the productivity thereof will be inferior. Further, since a-Si:H films generally contain hydrogen of not less than 10 atom %, bumping of hydrogen will be caused through rapid heating using excimer laser beams to result in peeling of films or roughing of surfaces when using the films as they are, and it was necessary to perform an additional heat-treatment process of preliminarily removing hydrogen contained in the film.

It has been proposed for a technique for solving the above subjects as will be explained below as a technique of manufacturing crystalline silicon films at low temperature.

Japanese Patent Unexamined Publication No. 8-250438 (1996) discloses a method for forming a silicon thin film through catalytic CVD methods in which a catalyst is heated to not less than a melting point of Si, in which a part of molecules of a raw material gas is made to contact the heated catalyst for resolution, and in which film forming is performed through CVD and crystal growth is performed on a substrate. In this method, a part of fly-coming species will reach quite a high temperature, behave as if the substrate surface would be of high temperature, and it is considered that the polycrystalline silicon is formed at a low substrate temperature. Actually, the raw material gas is a mixed gas of silicon (Si) compound gas and other substances and the catalyst is heated through supplied electric power. By setting the following conditions to be suitable for making the silicon thin film that is made from depository species to be a polycrystalline thin film, a polycrystalline silicon thin film is formed on a substrate of low temperature: a pressure condition in which the pressure of a reaction chamber for generating the silicon thin film is set to be at low pressure; a condition for a mixing ratio of raw material gas in which the ratio of gas containing other substances to gas of silicon compounds is set to be larger; and a condition for supplied electric power for the catalyst in which the electric power to be supplied to the catalyst is set to obtain a catalyst temperature that is not less than the melting point of silicon.

A method for forming a crystalline silicon film through chemical vapor deposition process in which resolution is performed through plasma resolution utilizing high-frequency inductive coupled plasma (ICP) and in which the resolved raw material gas is used is disclosed in Japanese Patent Unexamined Publication No. 10-265212 (1998) and No. 11-74204 (1999). In such a method, electric power of high frequency is invested through electrodes (antenna) for generating ICP (reference should be made to "Applied Physics", Hidero Sugai, Vol. 63, No. 6, 1994, pp. 559–567) for generating high density plasma of the raw material gas and for performing film forming through resolution and high excitation of the raw material gas. It is obvious from the above Japanese Patent Unexamined Publication No. 10-265212 that it is possible to obtain a polycrystalline silicon thin film with a conductivity that is higher by an order of magnitude by setting the high frequency electric power to not less than 800 W while the conductivity of the film is degraded in case the pressure exceeds 6.65 PA (50 mTorr) so that no minor-crystalline or polycrystalline silicon thin film could be obtained.

A method for film forming through plasma CVD in which ion beams are irradiated from the exterior for forming a crystalline silicon film is disclosed in Japanese Patent Unexamined Publication No. 11-145062 (1999). In such a method, surface excitation effects can be obtained by irradiating ion beams of 0.1 kV to 40 kV on to a film forming surface to thereby obtain a silicon thin film exhibiting favorable crystallinity.

However, while it seems to be possible to manufacture crystalline silicon films of minor-crystalline or polycrystalline type at temperatures in which glass substrates are applicable by using the above methods, all of the crystalline silicon films that may be obtained by the above techniques assume crystal structures in which crystals are grown on substrates in columnar styles so that large concaves and convexes are formed on these surfaces as illustrated in FIG. 1. This is due to the fact that growth of crystalline silicon films is dependent on a balance between film deposition of silicon type radical and etching using hydrogen atoms or halogen type radical. More particularly, since an etching speed within grain boundaries including a large amount of weak Si combinations is faster than an etching speed within the grains, the grain boundaries are selectively etched to expose the grains, and it is considered that concaves and convexes of 20 nm to 100 nm are generated thereby. Such concaves and convexes formed on the surface cause degradations in characteristics and reliability of the semiconductor device. For instance, in case of thin film transistors of top gate type, concaves and convexes formed on interfaces between channels and gate insulating films cause degradations in characteristics owing to scattering of carriers and further in degradations in reliability owing to broken insulations that are caused through partial thinning of gate insulating films.

Moreover, an amorphous layer is formed proximate to the interface with the substrate. This is a silicon layer that has deposited until a crystal core is formed which is necessary for the crystalline silicon to deposit on the substrate surface. Since the thickness of the amorphous layer generally accounts to several tens of nm in the proximity of the interface, they may be of disadvantage in case of forming thin film transistors in which thin and high crystalline semiconductor films are required.

Grain boundaries further exhibit relatively large defects so that they are apt to oxidation while problems of decreases in ON currents or increases in OFF currents are caused owing to oxidation of polycrystalline silicon grain boundaries in case of devices such as thin film transistors.

The respective film forming techniques further presented the following drawbacks.

In the catalyst CVD method (Japanese Patent Unexamined Publication No. 8-250438), film forming is performed by using only active species (radicals) generated through thermal resolution in a gaseous state. As stated, not only resolution but also increasing the temperature (moving energy) of a part of radicals to be sufficiently large is achieved through contact with the thermal catalyst for forming the crystalline silicon layer without increasing the substrate temperature. For achieving this effect, it is necessary to clear the problem of investing electric power to the thermal catalyst for heating purposes such that the thermal catalyst reaches an extremely high temperature of 1,700 to 1,800° C. This problem becomes especially remarkable in case of forming the film on substrates with large areas such as liquid crystal displays. The temperature thus needs to be set such that structures of devices and low-cost substrates made of glass or the like need to stand radiation generated through such thermal catalysts of high temperature.

In the method for forming a crystalline silicon film through PCVD using ICP (Japanese Patent Unexamined Publications No. 10-265212 and No. 11-74204), a crystalline silicon film is formed by generating high-density plasma of raw material gas owing to high frequency inductive coupling for performing more active resolution and excitation of raw material gas than in conventional plane-parallel type high frequency PCVD methods. However, it was found through Raman spectroscopy that the obtained film was not satisfactorily in view of crystallinity or film qualities, being either of minor-crystalline type (Japanese Patent Unexamined Publication No. 10-265212) or exhibiting large light conductivity (Japanese Patent Unexamined Publication No. 11-74204).

All of these techniques are techniques that have been made in view of high resolution and high excitation of raw material gas, and it is considered that the problem resides in lack of means for promoting crystallization and decreasing hydrogen densities in films. This is the reason why the amorphous film 21 is formed in proximity of the interface as illustrated in FIG. 1 owing to poor crystallinity of the film in proximity of the interface with the substrate.

Since ion beams of high acceleration are used in the method for irradiating ion beams onto the film forming surface from the exterior (Japanese Patent Unexamined Publication No. 11-145062), the entire device becomes a large-scaled one and it is difficult to uniformly treat a large surface are. It is further considered that many defects are generated in formed films since high-speed ion continuously hits against films during film forming.

In applying these as semiconductor elements of thin film transistors or solar batteries, it will be an important factor to perform control of crystallinity in proximities of interfaces with substrates and defect densities within films. None of the above-described conventional techniques are ready to cope with such subjects.

SUMMARY OF THE INVENTION

It is thus an object of the present invention to provide a semiconductor thin film and a manufacturing method thereof that can be directly formed on a substrate, that exhibits superior crystallinity at low temperature and low defect density, and that has a smooth surface.

It is another object thereof to provide a thin film transistor and a manufacturing method thereof that exhibits favorable characteristics as well as reliability and that is of favorable productivity.

It is still another object thereof to provide a liquid crystal display device and a manufacturing method thereof of improved image quality by forming a thin film transistor array exhibiting favorable characteristics and, reliability on a glass substrate of large surface area.

It is still another object of the present invention to provide a thin film transistor of superior characteristics, a liquid crystal display device of superior image quality and a solar cell of high conversion efficiency by decreasing intermixing of oxygen impurities into a crystalline semiconductor film.

It is still another object of the present invention to provide a device for manufacturing a semiconductor thin film in which control of film forming speeds or crystallinity can be easily and reliably performed.

It is still another object of the present invention to provide a semiconductor thin film, a semiconductor device employing the same and manufacturing methods thereof in which it is possible to use substrates of low costs such as those made of glass.

It is still another object of the present invention to provide a method for manufacturing a semiconductor device such as a transmitting type liquid crystal display or the like in which a light-transmitting semiconductor device may be easily manufactured.

It is still another object of the present invention to provide a semiconductor thin film that exhibits high field-effect mobility of TFTs when compared with a-Si:H films.

It is still another object of the present invention to provide a semiconductor thin film that may be employed as an active layer of a TFT as it is.

It is still another object of the present invention to provide a device for manufacturing a semiconductor thin film with which the above semiconductor thin films and a semiconductor device employing the same may be easily manufactured.

For achieving one of the above objects, the invention as recited in embodiment 1 of the present invention relates to a method for manufacturing a semiconductor thin film on a substrate through plasma resolution of raw material gas by employing a first energy, the method including at least an interfacial film forming process in which an interfacial film is formed on a surface of the substrate and a main body film growing process in which a semiconductor film is deposited and grown, wherein a second energy is added during the interfacial film forming process.

By the addition of the second energy during the interfacial film forming process as in the above arrangement, crystallinity in proximities of the substrate interface may be improved due to the addition of external energy through ion only on to the interfacial film.

By performing resolution of raw material gas including compositional elements of the semiconductor thin film by utilizing plasma, it is possible to further decrease the temperature of the substrate. It is preferable to generate the plasma through non-electrode discharge such as microwave plasma, helicon wave plasma, surface wave plasma, or electron cyclotron resonance plasma or through plane-parallel type capacitive coupling plasma with a power source frequency of 20 MHz to 100 MHz since the potential of plasma may be decreased thereby. It is more preferable to generate plasma through microwave plasma, surface wave plasma or plane-parallel type capacitive coupling plasma with a power source frequency of 20 MHz to 50 MHz, since the plasma potential will be not more than 30 V as it will be described later, and the growth of films on substrates of large surface areas may be easier performed.

According to the invention as recited in embodiment 2, the second energy of the invention as recited in embodiment 1 is ion energy.

According to the invention as recited in embodiment 3, the second energy of the invention as recited in embodiment 1 is optical energy.

For achieving one of the above objects, the invention as recited in embodiment 4 of the present invention relates to a method for manufacturing a semiconductor thin film on a substrate through plasma resolution of raw material gas, the method including at least an interfacial film forming process in which an interfacial film is formed on the substrate and a main body film growing process in which a semiconductor film is deposited and grown, wherein ion collision energy applied on the interfacial film surface during the interfacial film forming process is restricted to be larger than ion collision energy applied on the semiconductor film surface during the main body film growing process.

For achieving one of the above objects, the invention as recited in embodiment 5 of the present invention relates to a method for manufacturing a semiconductor thin film on a substrate through plasma resolution of raw material gas, the method including at least an interfacial film forming process in which an interfacial film is formed on the substrate and a main body film growing process in which a semiconductor film is deposited and grown, wherein ion flux applied on the interfacial film surface during the interfacial film forming process is restricted to be larger than ion flux applied on the semiconductor film surface during the main body film growing process.

By restricting the ion collision energy applied on the interfacial film surface during the film forming process to be larger than the ion collision energy applied on the semiconductor film surface during the main body film growing process or by restricting the ion flux applied on the interfacial film surface during the interfacial film forming process to be larger than the ion flux applied on the semiconductor film surface during the main body film growing process as in the above arrangements, external energy through ion may be added only onto the interfacial film for improving the crystallinity in proximities of the interface of the substrate (interfacial film). Further, by restricting irradiation of ion only onto the interfacial film, it is possible to reduce defects formed in the semiconductor film (main body film) since the main body film includes relatively more hydrogen than the interfacial film, and degradations in electric characteristics as a ready device can be restricted. With this arrangement, it is made possible to directly form a crystalline semiconductor film in a uniform manner with few defects also at a temperature enabling usage of a substrate of low costs such as one made of glass.

Note that the term "ion flux" denotes a radiation value of ion per unit time and unit area.

According to the invention as recited in embodiment 6, the ion collision energy applied to the interfacial film surface during the interfacial film forming process of the invention as recited in embodiment 4 is not less than 30 eV and not more than 1 key while the ion collision energy applied to the semiconductor film surface during the main body film growing process is not more than 30 eV.

By restricting the ion collision energy during the interfacial film forming process into the above range of not less than 30 eV and not more than 1 keV, it is possible to perform energy control by bias impression onto the substrate whereby it is enabled it to ignore the effect of spattering through ion. On the other hand, the reason for restricting the ion collision energy during the main body film growing process to not more than 30 eV is that the defect density of the semiconductor film will be increased in case this value exceeds 30 eV.

For achieving one of the above objects, the invention as recited in embodiment 7 of the present invention relates to a method for manufacturing a semiconductor thin film on a substrate through plasma resolution of raw material gas, the method including at least a main body film growing process in which a semiconductor film is deposited and grown on the substrate and a smoothing process for smoothing the surface of the semiconductor film, wherein ion collision energy applied on the semiconductor film surface during the smoothing process is restricted to be larger than ion collision energy applied on the semiconductor film surface during the main body film growing process.

For achieving one of the above objects, the invention as recited in embodiment 8 of the present invention relates to a method for manufacturing a semiconductor thin film on a substrate through plasma resolution of raw material gas by employing a first energy, the method including at least a main body film growing process in which a semiconductor film is deposited and grown on the substrate and a smoothing process for smoothing the surface of the semiconductor film, wherein ion flux applied on the semiconductor film surface during the smoothing process is restricted to be larger than ion flux applied on the semiconductor film surface during the main body film growing process.

By restricting the ion collision energy applied on the semiconductor film surface during the smoothing process to be larger than the ion collision energy applied on the semiconductor film surface during the main body film growing process or by restricting the ion flux applied on the semiconductor film surface during the smoothing process to be larger than the ion flux applied on the semiconductor film surface during the main body film growing process, it is possible to easily perform smoothing of the surface of the semiconductor film and to decrease defects of the main body film.

According t&the invention as recited in embodiment 9, the ion collision energy applied to the semiconductor film surface during the smoothing process of the invention as recited in embodiment 8 is not less than 36 eV and not more than 1 key while the ion collision energy applied to the semiconductor film surface during the main body film growing process is not more than 30 eV.

By restricting the ion collision energy during the smoothing process into the above range of not less than 36 eV and not more than 1 keV, it is possible to perform energy control by bias impression onto the substrate whereby it is enabled it to ignore the effect of spattering through ion. On the other hand, the reason for restricting the ion collision energy during the main body film growing process to not more than 30 eV is that the defect density of the semiconductor film will be increased in case this value exceeds 30 eV.

For achieving one of the above objects, the invention as recited in embodiment 10 of the present invention relates to a method for manufacturing a semiconductor thin film on a substrate through plasma resolution of raw material, the method including at least an interfacial film forming process in which an interfacial film is formed on the substrate, a main body film growing process in which a semiconductor film is deposited and grown, and a smoothing process for smoothing the surface of the semiconductor film, wherein ion collision energy applied on the interfacial film surface or the semiconductor film surface during the interfacial film forming process and the smoothing process is restricted to be larger than ion collision energy applied on the semiconductor film surface during the main body film growing process.

By restricting the ion collision energy applied onto the semiconductor film surface during the interfacial film forming process and the smoothing process to be larger than the ion collision energy applied on the semiconductor film surface during the main body film growing process, it is possible to improve crystallinity of the interface film, to easily perform smoothing of the surface of the semiconductor film and to decrease defects of the main body film.

According to the invention as recited in embodiment 11, the ion collision energy applied to the interfacial film surface during the interfacial film forming process of the invention as recited in embodiment 10 is not less than 30 eV and not more than 1 key while the ion collision energy applied to the semiconductor film surface during the main body film growing process is not more than 30 eV and the ion collision energy applied on the semiconductor film surface during the smoothing process is not less than 36 eV and not more than 1 keV.

By restricting the ion collision energy during the smoothing process into the above range of not less than 36 eV and not more than 1 keV and the ion collision energy applied onto the surface of the substrate during the interfacial film forming process to be not less than 30 eV and not more than 1 keV, it is possible to perform energy control by bias impression onto the substrate whereby it is enabled it to ignore the effect of spattering through ion. On the other hand, the reason for restricting the ion collision energy during the main body film growing process to not more than 30 eV is that the defect density of the semiconductor film will be increased in case this value exceeds 30 eV.

For achieving one of the above objects, the invention as recited in embodiment 12 of the present invention relates to a method for manufacturing a semiconductor thin film on a substrate through plasma resolution of raw material gas, the method including at least an interfacial film forming process in which an interfacial film is formed on the substrate, a main body film growing process in which a semiconductor film is deposited and grown, and a smoothing process for smoothing the surface of the semiconductor film, wherein ion flux applied on the interfacial film surface or the semiconductor film surface during the interfacial film forming process and the smoothing process is restricted to be larger than ion flux applied on the semiconductor film surface during the main body film growing process.

By restricting the ion flux applied on the semiconductor film surface during the interfacial film forming process and the smoothing process to be larger than the ion flux applied on the semiconductor film surface during the main body film growing process, it is possible to improve crystallinity of the interfacial film, to easily perform smoothing of the surface of the semiconductor film and to decrease defects of the main body film.

According to the invention as recited in embodiment 13, the ion collision energy as recited in claim 4 is controlled through a potential of the substrate.

According to the invention as recited in embodiment 14, the ion collision energy as recited in claim 4 is controlled through a potential of the plasma.

For achieving one of the above objects, the invention as recited in embodiment 15 of the present invention relates to a device for manufacturing a semiconductor thin film of plane-parallel type comprising a plasma source for performing plasma resolution of raw material gas, a bias electrode for controlling ion energy upon plasma resolution for irradiating the same onto a substrate, and a substrate heating means, wherein a power source frequency of the plasma source is not less than 20 MHz, and an ion energy that is controlled by the bias electrode not less than 30 eV and not more than 1 keV.

Here, the term "ion energy" denotes a difference between a potential of plasma including the ion and a potential of the substrate, and ion is accelerated owing to the presence of such difference.

For achieving one of the above objects, the invention as recited in embodiment 16 of the present invention is comprised of a plasma source for performing plasma resolution of raw material gas, a support base for supporting a substrate, and an electrode for controlling a potential of plasma.

By the provision of the electrode for controlling the potential of the plasma as in the above arrangement, ion energy may be easily and reliably controlled.

According to the invention as recited in embodiment 17, at least a part of the plasma and the electrode of the invention as recited in embodiment 16 are in contact with each other.

According to the invention as recited in embodiment 18, the electrode of the invention as recited in embodiment 16 is a frame-like electrode that comes in contact with peripheral edge portions of the plasma.

Since the plasma is a conductive body, it will be suffice if at least a part of the plasma is partially in contact with the electrode, while it is possible to reliably perform control of ion energy when the electrode is formed as a frame-like electrode that comes in contact with the peripheral edge portions of the plasma.

For achieving one of the above objects, the invention as recited in embodiment 19 of the present invention relates to a method for manufacturing a semiconductor thin film on a substrate through plasma resolution of raw material gas, the method including at least an interfacial film forming process in which an interfacial film is formed on the substrate and a main body film growing process in which a semiconductor film is deposited and grown, wherein a temperature rising speed of the interfacial film that is heated by means of an optical heating means during the interfacial film forming process is not less than 60° C./sec.

By setting the temperature rising speed of the interfacial film to be not less than 6° C./sec, film forming may be completed in a short time.

According to the invention as recited in embodiment 20, a heating temperature during the interfacial film forming process of the invention as recited in embodiment 19 is not less than a temperature of the substrate during the film forming process and not more than 1,200° C.

By making such restrictions, it is possible to cope with problems in which crystallization of the interfacial film becomes insufficient in case the heating temperature is less than the temperature of the semiconductor film during the semiconductor film forming process and in which a substrate of low melting point such as one made of glass may be deformed in case the temperature exceeds 1,200° C.

According to the invention as recite in embodiment 21, light that is irradiated during the interfacial film forming process of the invention as recited in embodiment 19 includes light having a wavelength of at least not more than 300 nm.

In case light having a wavelength of at least not more than 300 nm is included in irradiated light as in the above arrangement, only the semiconductor film on the substrate may be selectively heated.

For achieving one of the above objects, the invention as recited in embodiment 22 of the present invention is related to a device for manufacturing a semiconductor thin film comprising a plasma source for performing plasma resolution of raw material gas, a substrate, and an optical heating means for heating by irradiating light onto an interfacial film formed on an interface of the substrate, wherein a potential of plasma generated by the plasma source is not more than 30 V, and the interfacial film formed on the substrate is heated at a temperature rising speed of not less than 60° C./sec.

According to the invention as recited in embodiment 23, the heating means of the invention as recited in embodiment 22 is comprised of the optical heating means only.

According to the invention as recited in embodiment 24, the device of the invention as recited in embodiment 22 further comprises a heating means for the substrate that is incorporated in a support base for the substrate in addition to the optical heating means.

By the above arrangement, it is possible to increase the temperature of the substrate in a more rapid manner.

According to the invention as recited in embodiment 25, light that is emitted from the optical heating means of the invention as recited in embodiment 22 includes light having a wavelength of at least not more than 300 nm.

For achieving one of the above objects, the invention as recited in embodiment 26 of the present invention is related to a method for manufacturing a semiconductor thin film on a substrate through plasma resolution of raw material gas, the method including at least an impurity adding process of adding an impurity that affects surface reaction of the surface of the substrate at the time of performing interfacial film forming and a main body film forming process in which a semiconductor film is deposited and grown, wherein the impurity adding process and the main body film forming process are performed without exposure to atmosphere.

By the inclusion of an impurity that affects surface reaction of the surface of the substrate at the time of performing interfacial film forming, it is possible to directly form crystalline semiconductor film that is uniform and includes few defects also at a temperature in which a substrate of low costs such as one made of glass may be used. When performing the impurity adding process and the main body film forming process without exposure to atmosphere, it is possible to restrict oxidation of the interfacial film.

According to the invention as recited in embodiment 27, the impurity of the invention as recited in embodiment 26 exhibits catalytic actions.

According to the invention as recited in embodiment 28, the impurity of the invention as recited in embodiment 26 is at least one selected from a group consisting of phosphorus, boron, nickel, and palladium, and an amount of addition of the impurity is in a range of $1 \times 10^{16}$ cm$^{-3}$ to $1 \times 10^{-19}$ cm$^-$.

The reason for setting the amount of addition of the impurity to be in the range of $1 \times 10^{16}$ cm$^{-3}$ to $1 \times 10^{19}$ cm$^{-3}$ is that effects of improving crystallinity become inferior in case the amount of addition of the impurity is less than $1 \times 10^{16}$ cm$^{-3}$ and that insulating characteristics are spoiled in case the value exceeds $1 \times 10^{19}$ cm$^{-3}$.

According to the invention as recited in embodiment 29, a temperature of the substrate during the main body film forming process of the invention as recited in embodiment 26 is not more than 400° C.

By restricting the temperature of the substrate during the semiconductor film forming process to be not more than 400° C., it is possible to prevent dispersion of the impurity including in the substrate and the like into the semiconductor film .

For achieving one of the above objects, the invention as recited in embodiment 30 of the present invention is related to a crystalline semiconductor thin film manufactured through plasma resolution of raw material gas including at least an interfacial film formed on a surface of a substrate and a main body film formed on the interfacial surface, wherein a defect density of the main body film is lower than that of the interfacial film.

According to the invention as recited in embodiment 31, a hydrogen density of the interfacial film of the invention as recited in embodiment 30 is lower than that of the main body film.

For achieving one of the above objects, the invention as recited in embodiment 32 of the present invention is related to a crystalline semiconductor thin film of columnar structure manufactured through plasma resolution of raw material gas, wherein a surface of the semiconductor thin film is smooth.

By the provision of the smooth surface of the semiconductor thin film, it is possible to prevent degradations in characteristics of an entire device in case the thin film is applied to such a device. Note that the term "smooth surface" in the present description denotes a case in which concaves and convexes of the surface are not more than 10 nm.

For achieving one of the above objects, the invention as recited in embodiment 33 of the present invention is related to a thin film transistor using a crystalline semiconductor thin film that has been manufactured through plasma resolution of raw material gas as an active layer, comprising at least an interfacial film formed on a surface of a substrate and a main body film formed on the interfacial film, wherein a defect density of the main body film is lower than that of the interfacial film.

By the above provision, the semiconductor film serving as the active layer exhibits high crystallinity from a proximity of the interface of the substrate, an ON current of the transistor will become high owing to the low defect density of the semiconductor film, and thinning of the film may be easily performed.

According to the invention as recited in embodiment 34, a hydrogen density of the interfacial film of the invention as recited in embodiment 33 is lower than a hydrogen density of the main body film.

For achieving one of the above objects, the invention as recited in embodiment 35 of the present invention is related to a liquid crystal display device in which pixels are driven through a thin film transistor employing a crystalline semiconductor thin film that has been manufactured through plasma resolution of raw gas material as an active layer, the crystalline semiconductor thin film including at least an interfacial film and a main body film, wherein a defect density of the main body film is lower than a defect density of the interfacial film.

In the above arrangement, the semiconductor thin film serving as the active layer of the thin film transistor for driving pixels exhibit high crystallinity from a proximity of the interface of the substrate, and driving performances of pixels as affected by the thin film transistor are improved owing to the low defect density of the film. Thus, it is possible to achieve high image quality of the liquid crystal display device.

For achieving one of the above objects, the invention as recited in embodiment 36 of the present invention is related to a thin film transistor employing a crystalline semiconductor thin film of columnar arrangement that has been manufactured through plasma resolution of raw gas material as an active layer, wherein an upper surface of the crystalline semiconductor thin film of columnar structure is smooth.

By the provision of a smooth upper surface of the crystalline semiconductor thin film as in the above arrangement, it is possible to increase the ON current and to improve reliability of the thin film transistor.

For achieving one of the above objects, the invention as recited in embodiment 37 of the present invention is related to a method for manufacturing a thin film transistor employing a crystalline semiconductor thin film of columnar arrangement that has been manufactured through plasma resolution of raw gas material as an active layer, wherein an upper surface of the semiconductor thin film is smoothed by controlling ion collision energy at the time of depositing the semiconductor thin film through plasma CVD method.

For achieving one of the above objects, the invention as recited in embodiment 38 of the present invention is related to a liquid crystal display device in which pixels are driven by a thin film transistor employing a crystalline semiconductor thin film of columnar arrangement that has been manufactured through plasma resolution of raw gas material as an active layer, wherein an upper surface of the crystalline semiconductor thin film of columnar structure is smooth.

In case at least the upper surface of the crystalline semiconductor thin film is smooth as in the above arrangement, it is possible to achieve improvements in driving performances of the pixels and reliability of the thin film transistor so that it is possible to provide a liquid crystal display device of high image quality.

For achieving one of the above objects, the invention as recited in embodiment 39 of the present invention is related to a thin film transistor employing a crystalline semiconductor thin film that has been manufactured through CVD method as an active layer, wherein at least an upper surface of a channel portion comprised of the crystalline semiconductor film is covered by an oxidation-preventing film.

By covering at least the upper surface of the channel portion by the oxidation-preventing film, it is possible to decrease the amount of oxygen impurities being intermixed into the semiconductor film. Thus, it is possible to increase the ON current of the thin film transistor and to decrease the OFF current.

According to the invention as recited in embodiment 40, an amount of oxygen contained in the oxidation-preventing film of the invention as recited in embodiment 39 is less than an amount of oxygen contained in the crystalline semiconductor thin film.

According to the invention as recited in embodiment 41, the oxidation-preventing film of the invention as recited in embodiment 39 is a silicon nitride film.

For achieving one of the above objects, the invention as recited in embodiment 42 of the present invention is related to a method for manufacturing a thin film transistor employing a crystalline semiconductor thin film that has been manufactured through CVD method as an active layer, wherein an oxidation-preventing film is formed successively after depositing the crystalline semiconductor thin film without exposure to atmosphere.

In the above method, it is possible to prevent intermixing of oxygen impurities into the semiconductor thin film.

For achieving one of the above objects, the invention as recited in embodiment 43 of the present invention is related to a liguid crystal display device in which pixels are driven by a thin film transistor employing a crystalline semiconductor thin film that has been manufactured through CVD method as an active layer, wherein at least an upper surface of at least the crystalline semiconductor thin film comprising the thin film transistor for driving the pixels is covered by an oxidation-preventing film.

In case at least the upper surface of the semiconductor thin film is covered by the oxidation-preventing film as in the above arrangement, it is possible to reduce intermixing of oxygen impurity into the semiconductor thin film so that it is possible to achieve improvements in driving performances of pixels and retaining characteristics of the thin film transistor and thus to provide high image qualities of the liquid crystal display device.

For achieving one of the above objects, the invention as recited in embodiment 44 of the present invention is related to a solar cell employing a crystalline semiconductor thin film of columnar arrangement as a photoelectric converting layer, wherein an upper surface of the crystalline semiconductor thin film comprising a main body layer of intrinsic semiconductors is covered by an oxidation-preventing film that is not of columnar structure.

In case the upper surface of the semiconductor thin film of the intrinsic semiconductor layer that serves as the photoelectric converting layer is covered by the oxidation-preventing film that is not of columnar structure, it is possible to reduce intermixing of oxygen impurity to the intrinsic semiconductor layer so that a converting efficiency of the solar cell may be improved.

For achieving one of the above objects, the invention as recited in embodiment 45 of the present invention is related to a method for manufacturing a solar cell comprising a crystalline semiconductor thin film of columnar arrangement, wherein an oxidation-preventing film that is not of columnar structure is successively formed after depositing the crystalline semiconductor the film without exposure to atmosphere.

According to the invention as recited in embodiment 46, the raw material gas containing compositional elements of the semiconductor thin film of the invention as recited in embodiment 4 is diluted by hydrogen gas or inert gas.

In case the raw material containing compositional elements of the semiconductor thin film is diluted by hydrogen gas or inert gas as in the above arrangement, it is possible to easily control the film forming speed or crystallinity.

According to the invention as recited in embodiment 47, the temperature of the substrate at the time of forming the semiconductor thin film in the invention as recited in embodiment 4 is set to be 100 to 600° C.

By setting the temperature of the substrate at the time of forming the semiconductor thin film to be not more than 600° C., it is possible to use substrates of low costs such as those made of glass.

According to the invention as recited in embodiment 48, the semiconductor thin film of the invention as recited in embodiment 4 is either micro-crystalline silicon or polycrystalline silicon.

According to the invention as recited in embodiment 49, the semiconductor thin film of the invention as recited in embodiment 1 is either micro-crystalline silicon or polycrystalline silicon.

According to the invention as recited in embodiment 50, the semiconductor, thin film of the invention as recited in embodiment 1 is either micro-crystalline silicon or polycrystalline silicon.

In case the semiconductor thin film is comprised of micro-crystalline silicon or polycrystalline silicon, the field-effect mobility of the TFT will be higher than compared to that of a-Si:H films. Note that the terms "micro-crystalline silicon" or "polycrystalline silicon" indicate silicon other than amorphous silicon and single-crystalline silicon.

According to the invention as recited in embodiment 51, the substrate of the invention as recited in embodiment 4 is a light-transmitting type substrate.

According to the invention as recited in embodiment 52, the substrate of the invention as recited in embodiment 1 is a light-transmitting type substrate.

According to the invention as recited in embodiment 53, the substrate of the invention as recited in embodiment 1 is a light-transmitting type substrate.

In case a light-transmitting type substrate is employed as the substrate, it will be favorable in view of manufacturing light-transmitting products such as transmitting-type liquid crystal displays or the like.

According to the invention as recited in embodiment 54, a buffer layer is provided on the surface of the substrate of the invention as recited in embodiment 4.

According to the invention as recited in embodiment 55, a buffer layer is provided on the surface of the substrate of the invention as recited in embodiment 1.

According to the invention as recited in embodiment 56, a buffer layer is provided on the surface of the substrate of the invention as recited in embodiment 1.

By the provision of the buffer layer on the surface of the substrate, it is possible to prevent dispersion of the impurity included in the substrate into the semiconductor thin film, and further to improve adhesiveness of the film.

According to the invention as recited in embodiment 57, a thickness of the semiconductor thin film of the invention as recited in embodiment 1 is not less than 20 nm and not more than 500 nm.

By this arrangement, it is possible to the employ the thin film as a TFT by maintaining its original film thickness and without additionally performing etching or film forming.

According to the invention as recited in embodiment 58, laser annealing of the semiconductor thin film of the invention as recited in embodiment 4 is performed.

According to the invention as recited in embodiment 59, laser annealing of the semiconductor thin film of the invention as recited in embodiment 37 is performed.

With this arrangement, it is possible to obtain a semiconductor thin film and a thin film transistor exhibiting even higher performance.

DESCRIPTION OF THE PREFERRED EMBODIMENTS

Embodiments of the present invention will now be explained in details.

First Embodiment

The present embodiment relates to a method for manufacturing a semiconductor thin film and a device for manufacturing the same in which ion energy supplied onto a film forming surface is controlled in a process of forming a semiconductor thin film for manufacturing a semiconductor thin film exhibiting favorable crystallinity also in proximity of an interface with a substrate and having a smooth surface.

Figure 1:
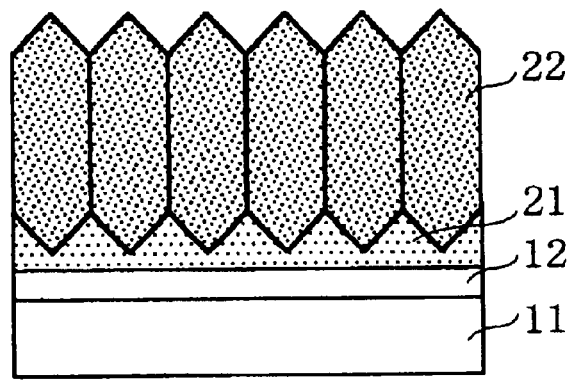
FIG. 1 is a sectional view showing a conventional semiconductor thin film.
Figure 2:
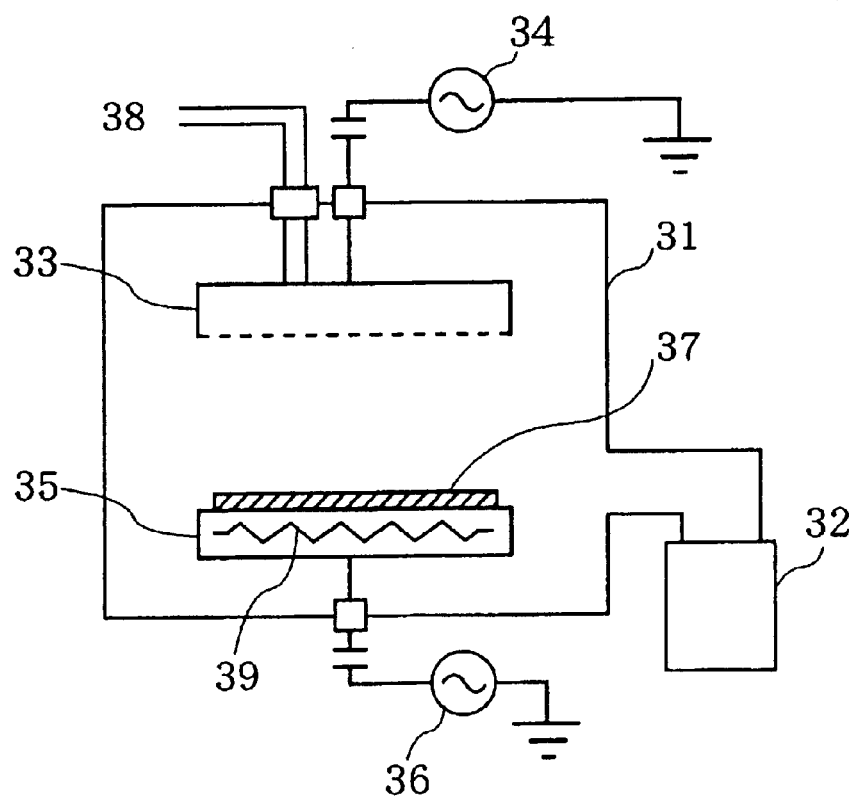
FIG. 2 is a schematic view showing a device for manufacturing a semiconductor thin film according to a first embodiment.

FIG. 2 is a schematic view showing a device for manufacturing a semiconductor thin film according to the first embodiment.

More particularly, a discharge electrode 33 for generating plasma and a bias electrode 35 for substrate bias are provided in a vacuum container 31 in which a vacuum condition is achieved through exhaust utilizing an exhaust pump 32. Raw material gas for forming the film is supplied into the vacuum container 31 through a gas introducing system 38. Plasma resolution of the raw material gas into ion and radical is performed through high-frequency electric power impressed onto the discharge electrode 33 through a high-frequency oscillator 34, and film forming is performed through deposition onto a substrate 37 located above the bias electrode 35. By setting an oscillating frequency of the high-frequency electric power at this time to be not less than 20 MHz, and particularly to be 27.12 MHz, it is possible to set an ion collision energy applied to the substrate to be not more than 30 eV. By restricting the ion collision energy, ion damages generated at the time of film forming may be ignored. Since the ion collision energy indicates a difference between plasma potential and floating potential at the substrate 37, it may be controlled to be in a range of approximately 30 eV to 1 keV by varying the electric power to be impressed on the bias electrode 35 and the oscillating frequency thereof.

The higher the oscillating frequency of the high-frequency electric power for plasma generation is, the smaller the ion collision energy applied on the substrate will be and thus favorable, while discharge on a large surface area may become difficult in case it is too high. Thus, it is desirable to set the oscillating frequency in a range of 20 MHz to 100 MHz when performing film forming on a large-sized substrate as one employed in a liquid crystal display or the like.

In the arrangement of the device for manufacturing a semiconductor thin film of the first embodiment, the discharge electrode 33 and the bias electrode 35 are separately provided so that grain composition within the plasma and ion energy control may be individually performed. The bias electrode 35 is further provided with a heating heater 39 for controlling the temperature to control the temperature of the substrate during film forming in a range of room temperature and 600° C. It should be noted that the same effects as those of the present invention may be achieved even if the bias electrode and the heating heater for controlling the temperature are separated.

Figure 3:
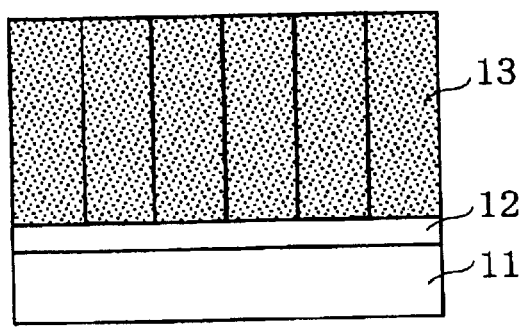
FIG. 3 is a sectional view showing a semiconductor thin film of the present invention.

Concrete methods for manufacturing a semiconductor thin film by using the device for manufacturing the semiconductor thin film according to the first embodiment of the present invention will now be explained. It should be noted that in the illustrated embodiment, monosilane ($SiH_4$) gas and hydrogen ($H_2$) are employed as raw material gas in the device for manufacturing a semiconductor thin film as illustrated in FIG. 3 wherein this mixed raw material gas is introduced into the vacuum container 31 through the gas introducing system 38.

High-frequency electric power of 27.12 MHz and 500 W is impressed on the discharge electrode 33 for generating plasma as an interfacial film forming process. By impressing a bias electric power of 400 kHz onto the bias electrodes 35 at this time, the potential of the substrate 37 provided on the bias electrode 35 is controlled. An ion accelerating voltage of approximately 150 V is generated by impressing electric power of 75 W. Thus, high energy ion accelerated through neutral radical within the plasma and bias potential field is irradiated onto the surface of the substrate 37, and crystallinity of the silicon film is improved by the energy applied onto the surface of the interfacial film through ion. In the illustrated embodiment, a silicon film having a thickness of 10 nm and exhibiting favorable crystallinity is deposited on the substrate interface under these conditions.

In a main body film forming process, a crystalline silicon film is deposited by using monosilane ($SiH_4$) gas and hydrogen ($H_2$) as raw materials. No bias electric power is impressed but high-frequency electric power of 27.12 MHz and 200 W is impressed only to the discharge electrode. By setting the discharge frequency to be 27.12 MHz, the floating potential of the substrate 37 will be approximately 0 V so that it is possible to restrict generation of defects owing to ion collision. A crystalline silicon film having a thickness of 190 nm is deposited under these conditions, and a crystalline silicon film having a thickness of 200 nm as a whole is obtained. The thus obtained film exhibits favorable crystallinity also at the substrate interface, and a defect density of the film is also low.

For smoothing the surface of the semiconductor film, a smoothing process is performed succeeding the main body film forming process in which film forming is performed through $SiH_4/H_2$ plasma at a bias electric power of 25 W and a discharge electric power of 200 W. Through impressing bias to the substrate 37, the ion collision energy will become 50 eV so that smoothing of the surface may be performed. Concaves and convexes formed on the surface when a silicon film having a thickness of 20 nm was deposited to assume an overall thickness of 220 nm were approximately 5 nm.

As illustrated in FIG. 3, in the crystalline silicon film that is formed by using the method according to the illustrated embodiment, a columnar crystalline silicon film 13 is growing from the interface of the buffer layer provided on the surface of the substrate and assumes a smooth surface. The defect density of the film is also low.

Figure 4:
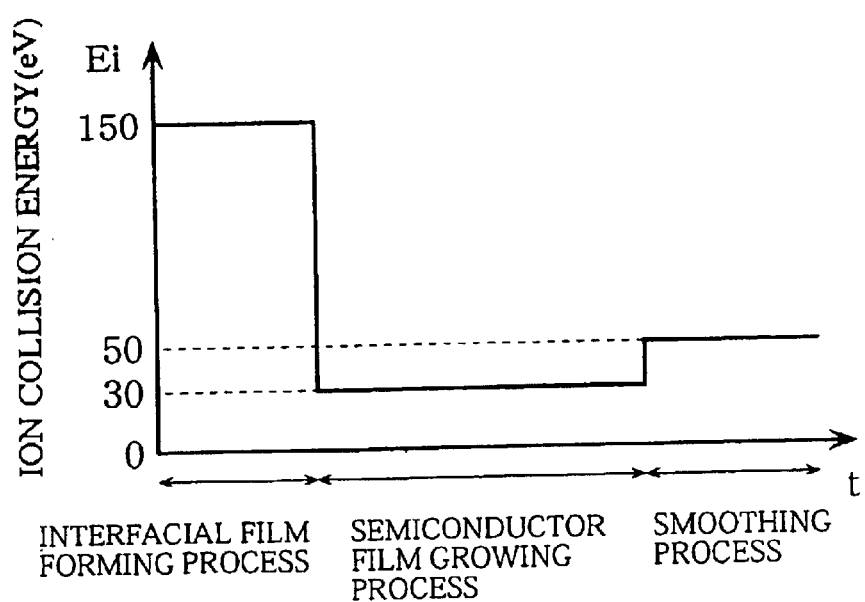
FIG. 4 is a graph showing changes in ion collision energy during an interfacial film forming process, a main body film forming process, and a smoothing process.

Variations in ion collision energy during the interfacial film forming process, the main body film forming process and the smoothing process of the illustrated embodiment are illustrated in FIG. 4. It should be noted that it is favorable that the ion collision energy during the film forming method of the main body be not more than 30 eV since the defect density of the semiconductor film will be low. It is further favorable that the ion collision energy during the film forming method of the interface be not less than 30 eV and not more than 1 keV since energy may be controlled through bias impression to the substrate and effects of spattering through ion may be ignored. Moreover, it is favorable that the ion collision energy during the smoothing process be not less than 36 eV and not more than 1 keV since energy may be controlled through bias impression to the substrate and effects of spattering through ion may be ignored.

The above-described first embodiment is advantaged in that the arrangement of the device is simple since ion for performing energy control is not limited but entirely irradiated. Since ion of large mass number such as silicon type ion is also being irradiated, the above effects may be achieved also in case the ion energy is relatively low.

In addition thereto, while the ion energy has been set to be high in the interfacial film forming process and the smoothing process in the above-described first embodiment, the same effects may be achieved also by increasing the ion flux since energy applied onto the film forming surface may thus be increased as well. It should be noted that various methods might be taken for increasing the ion flux, such as increasing the discharge electric power.

Other Matters (1) While the frequency of the high-frequency electric power impressed to the discharge electrode 33 may be set to be a frequency with which the ion collision energy applied to the surface of the substrate 37 becomes low, it is preferable to set the frequency within a range of approximately 20 MHz to 100 MHz, for instance, to 27.12 MHz. When the frequency is low within the above range of the frequency, a conditional range in which discharge may be performed will be expanded and is favorable in view of allowing a certain degree of freedom in arranging the device. On the other hand, in case the frequency is high, an electron density within the plasma will be high and the plasma potential low and is favorable in view of a rapid film forming speed and of forming a silicon film including little ion collision damages.

(2) The raw material gas is not limited to monosilane ($SiH_4$) as employed in the above-described first embodiment, and it is alternatively possible to employ disilane ($Si_2H_6$), silane chloride ($SiH_2Cl_2$ etc), silane fluoride ($SiF_4$ etc) or monogermane ($GeH_4$). As for the dilution gas, it is also possible to employ rare gas such as argon, xenon or helium instead of hydrogen.

(3) Setting the temperature of the substrate at the time of forming the film in a range of 100 to 600° C. is favorable since it allows the usage of substrates of low costs such as those made of glass. It is more preferable to set the temperature of the substrate to not more than 450° C. since the manufacturing device may be made of aluminum. Further, setting the temperature of the substrate in a range of 100 to 350° C. is even more preferable since the film forming surface may be activated by an extend with which hydrogen contained in the film will not be parted so that a semiconductor film of high quality may be formed.

(4) Employing an arrangement in which a buffer layer is provided on the surface of the substrate is preferable since dispersion of impurities contained in the substrate into the semiconductor thin film may be prevented.

(5) While plane-parallel type plasma has been employed as plasma in the above-described first embodiment, the present invention is not limited to this, and it is alternatively possible to employ inductive coupled plasma, microwave plasma, helicon wave plasma, surface wave plasma or electron cyclotron resonance plasma. In case of employing plasma such as microwave plasma obtained through non-electrode discharge, the discharge frequency does not need to be in the above range for the frequency, and it is alternatively possible to employ a frequency of 2.45 GHz or the like. As long as the electron temperature and the ion collision energy may be restricted to be low, the invention is not limited to these plasma generating methods, and it is possible to apply any suitable method to the method for manufacturing a semiconductor thin film or the manufacturing device thereof of the present invention.

(6) While the discharge electrode 33 has been employed for generating plasma in the above-described first embodiment, it is alternatively possible to employ non-electric discharge employing microwaves or the like. However, it is preferable to restrict the ion collision energy applied to the substrate to be not more than 30 eV.

Second Embodiment

Figure 5:
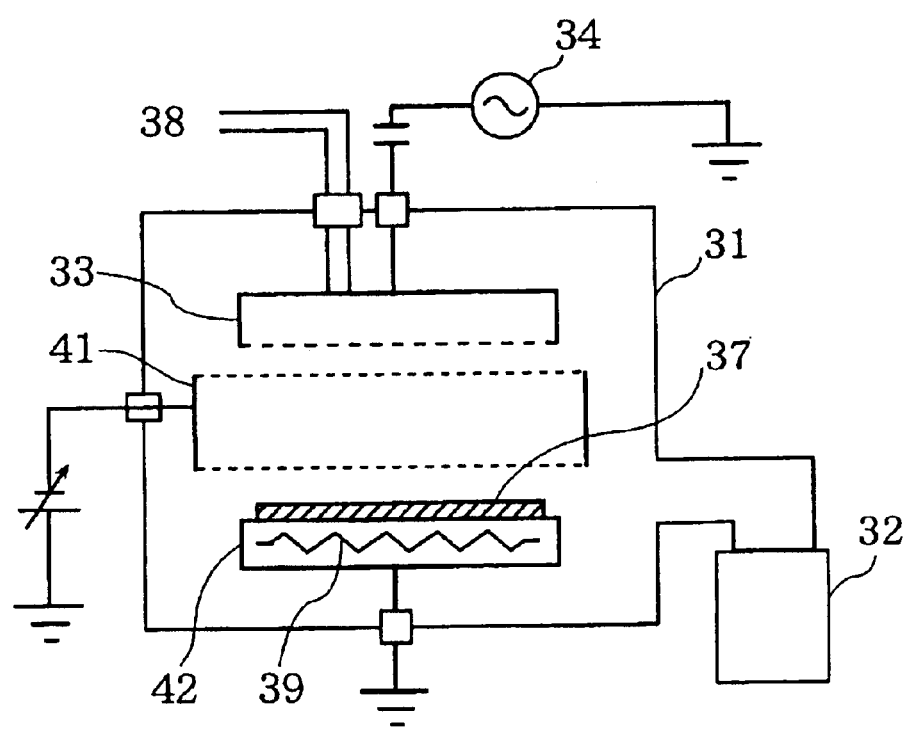
FIG. 5 is a schematic view showing a device for manufacturing a semiconductor thin film according to a second embodiment.

FIG. 5 is a schematic view showing a device for manufacturing a semiconductor thin film according to a second embodiment.

More particularly, a discharge electrode 33 for generating plasma, an opposing electrode 42 comprised with a heating heater 39, and a control electrode 41 for controlling a potential of the plasma are provided in a vacuum container 31 in which a vacuum condition is achieved through exhaust utilizing an exhaust pump 32. Raw material gas for forming the film is supplied into the vacuum container 31 through a gas introducing system 38. Plasma resolution of the raw material gas into ion and radical is performed through high-frequency electric power impressed onto the discharge electrode 33, and film forming is performed through deposition onto a substrate 37 located above the opposing electrode 42. By setting an oscillating frequency of the high-frequency electric power at this time to be not less than 20 MHz, and particularly to be 27.12 MHz, and by setting the potential of the control electrode 41 to be a grounding potential or a negative potential, it is possible to set an ion collision energy applied to the substrate to be not more than 30 eV. In case positive bias is impressed on the control electrode 41 and the potential of the control electrode 41 is increased, the plasma potential will be accordingly increased so that the plasma potential can be controlled to be not less than 30 eV. Since the potential of the substrate 37 is maintained constant, it is possible to control the ion collision energy in this manner.

Other Matters (1) While the discharge electrode 33 has been used for generating plasma in the second embodiment, it is also possible to employ non-electrode discharge employing microwaves or the like. It is, however, desirable to control the ion collision energy applied to the substrate to be not more than 30 eV.

Figure 6:
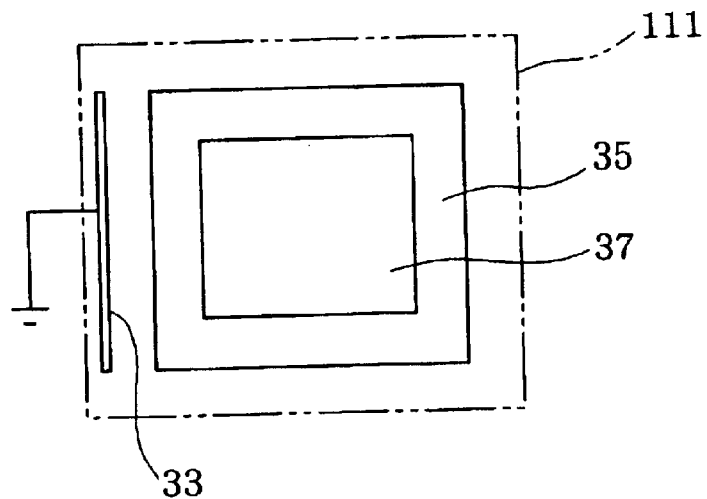
FIG. 6 is an explanatory view showing an arrangement of a control electrode.
Figure 7:
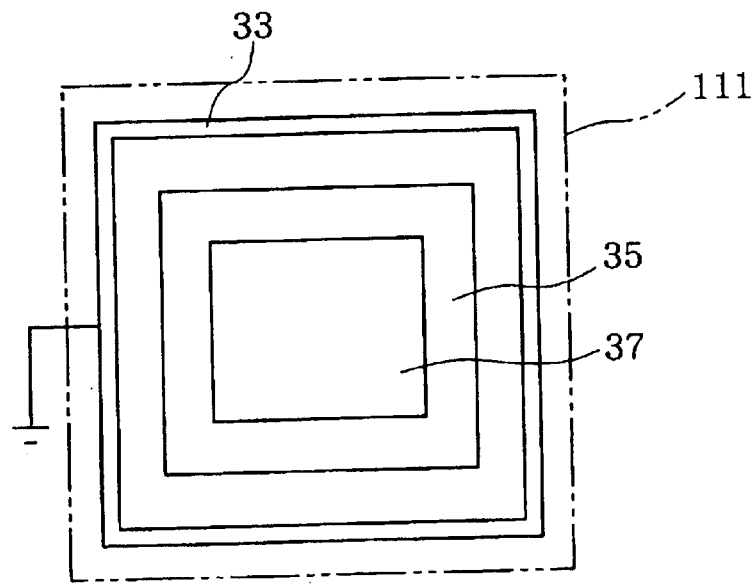
FIG. 7 is an explanatory view showing an arrangement of another control electrode.

(2) As for the arrangement of the control electrode 41, it may either be an arrangement in which it is in contact with at least a part of plasma 111 as illustrated in FIG. 6 or a frame-like arrangement in which it is in contact with peripheral edge portions of the plasma 111 as illustrated in FIG. 7.

Third Embodiment

The third embodiment is related to a method for manufacturing a semiconductor thin film in which an impurity that serves as a catalyst for improving crystallinity is added onto the surface of the substrate. The impurity may be nickel (Ni), palladium (Pd), boron (B) or phosphorous (P). In the third embodiment, phosphorous ion ($PH_x^+$, x=0 to 3) is used as the impurity wherein an injection process of the impurity ion to the substrate and deposition of crystalline silicon film during the main body film forming process are performed in a same vacuum space by using the means as illustrated in FIG. 5. When injecting phosphorous ion ($PH_x^+$), particularly phosphine ($PH_3$) and hydrogen ($H_2$) gas are used as raw material gas during the interfacial film forming process, and plasma resolution of the raw material gas is performed by impressing high-frequency electric power to the discharge electrode 33. By further impressing bias electric power to the bias electrode 35, an ion acceleration voltage of several hundreds to 1 kV is generated. In this manner, phosphorous ion ($PH_x^+$) within the plasma is accelerated and injected to the substrate. The amount of injection is preferably set to be in range of $1\times10^{16}$ cm$^{-3}$ to $1\times10^{19}$ cm$^{-3}$, for instance, to $1\times10^{18}$ cm$^{-3}$.

It should be noted that in case boron ion ($B_2H_x^+$, x=0 to 5) is to be injected, a mixed gas of diboron ($B_2H_6$) and hydrogen ($H_2$) is employed as the raw material gas.

A crystalline silicon layer is deposited in the main body film forming process by using monosilane ($SiH_4$) and hydrogen ($H_2$) as raw material. Here, no bias electric power is impressed but a high-frequency electric power of 27.12 MHz and 300 W is impressed only on the discharge electrode. Phosphorus added to the surface of the substrate serves as a catalyst so that a film of favorable crystallinity is formed also in proximities of the substrate interface. Since the discharge frequency is set to be 27.12 MHz, the plasma potential is low and the potential of the substrate 37 is also substantially 0 V so that generation of defects owing to ion collision can be restricted.

With this arrangement, the crystalline silicon thin film that is formed in the illustrated embodiment exhibits favorable crystallinity also as an interfacial film and the defect density of the main body film is also low.

In case of using Ni, Pd or the like as the catalyst, film growing of the main film may be performed by using the device for manufacturing a semiconductor thin film as used in the illustrated embodiment (FIG. 2) upon injecting the impurity by using a general ion injecting means.

The frequency of the high-frequency electric power that is impressed on the discharge electrode 33 shall be set to be a frequency with which the ion collision energy applied onto the surface of the substrate 37 becomes low, while it is preferable to set the frequency to be in a range of approximately 20 MHz to approximately 100 MHz, for instance, to 27.12 MHz. When the frequency is low within the above range of the frequency, a conditional range in which discharge may be performed will be expanded and is favorable in view of allowing a certain degree of freedom in arranging the device. On the other hand, in case the frequency is high, an electron density within the plasma will be high and the plasma potential low and is favorable in view of a rapid film forming speed and of forming a silicon film including little ion collision damages.

Other Matters (1) The raw material gas is not limited to monosilane ($SiH_4$) as employed in the above-described first embodiment, and it is alternatively possible to employ disilane ($Si_2H_6$), silane chloride ($SiH_2Cl_2$ etc), silane fluoride ($SiF_4$ etc) or monogermane ($GeH_4$). As for the dilution gas, it is also possible to employ rare gas such as argon, xenon or helium instead of hydrogen.

(2) Setting the temperature of the substrate at the time of forming the film in a range of 100 to 600° C. is favorable since it allow the usage of substrates of low costs such as those made of glass. More preferably, the temperature of the substrate at the time of film forming shall be set to be not more than 400° C., for instance, to 300° C., since it is possible to prevent dispersion of the impurity injected to the substrate into the semiconductor thin film to thereby degrade characteristics of the semiconductor thin film.

(3) Employing an arrangement in which a buffer layer is provided on the surface of the substrate is preferable since dispersion of impurities contained in the substrate into the semiconductor thin film may be prevented.

(4) While plane-parallel type plasma has been employed as plasma in the above-described first embodiment, the present invention is not limited to this, and it is alternatively possible to employ inductive coupled plasma, microwave plasma, helicon wave plasma, surface wave plasma or electron cyclotron resonance plasma. In case of employing plasma such as microwave plasma obtained through non-electrode discharge, the discharge frequency does not need to be in the above range for the frequency, and it is alternatively possible to employ a frequency of 2.45 GHz or the like. As long as the electron temperature and the ion collision energy may be restricted to be low, the invention is not limited to these plasma generating methods, and it is possible to apply any suitable method to the method for manufacturing a semiconductor thin film or the manufacturing device thereof of the present invention.

Fourth Embodiment

The present embodiment relates to a method for manufacturing a semiconductor thin film and a device for manufacturing the same for forming a semiconductor thin film of favorable crystallinity also in proximities of an interface with a substrate by performing rapid heating through a lamp in the interfacial film forming process.

Figure 8:
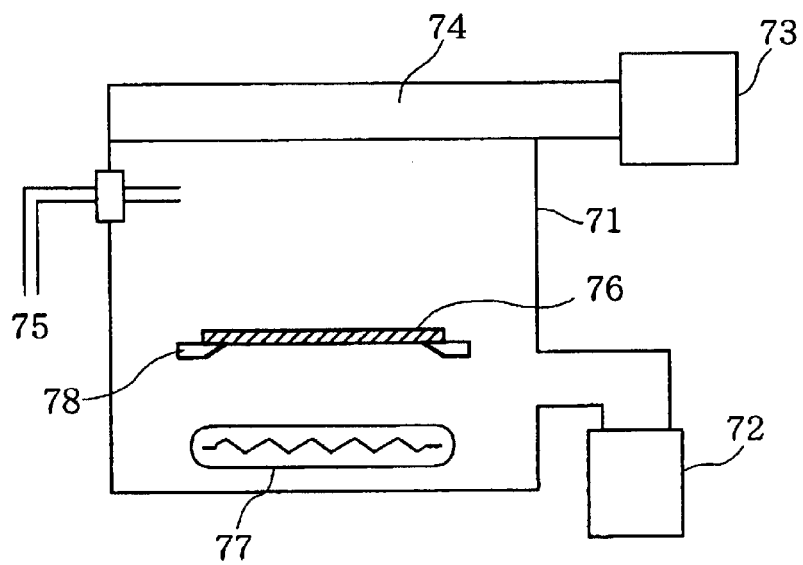
FIG. 8 is a schematic view showing a device for manufacturing a semiconductor thin film according to a fourth embodiment.

FIG. 8 is a schematic view showing a device for manufacturing a semiconductor thin film according to a fourth embodiment.

More particularly, a substrate 76 that is supported by a support base 78 and a lamp 77 for directly irradiating light on a rear surface of the substrate 76 are provided within a vacuum container 71 that is in which a vacuum condition is achieved through exhaust utilizing an exhaust pump 72. Raw material gas for film forming is supplied into the vacuum container 71 through a gas introduction system 75. The raw material gas is generated by a microwave oscillator 73, plasma resolution of the raw material gas into ion and radical is performed through microwave electric power supplied into the vacuum container 71 through an introduction tube 74, and film forming is performed through deposition onto the substrate 76. The plasma that is generated by this plasma source assumes a low electron temperature so that the ion collision energy applied to the substrate 76 is also low. The temperature of the substrate at the time of film forming is controlled to be in a range of room temperature to approximately 1,200° C. achieved through optical heating using the lamp 77, and it is also possible to perform rapid heating at a temperature rising speed of not less than 6° C./sec. The lamp may be a halogen lamp, xenon lamp, deuteride lamp or an ultraviolet lamp, while it is desirable to employ a lamp with a large light quantity and a wavelength of not more than 300 nm for selectively heating the silicon film formed on the substrate.

Concrete forms for embodying a method for manufacturing a semiconductor thin film by employing the device for manufacturing a semiconductor thin film according to the fourth embodiment of the present invention will now be explained. It should be noted that in the fourth embodiment, inonosilane ($SiH_4$) and hydrogen ($H_2$) gas are employed as raw material gas in the device for manufacturing a semiconductor thin film as illustrated in FIG. 8 wherein this mixed raw material gas is introduced into the vacuum container 71 through the gas introducing system 75.

In the interfacial film forming process, the temperature of the substrate is set to be 300° C. through heating with the lamp and microwave plasma having a microwave electric power of 200 W is generated. While the silicon film formed under these conditions does not exhibit favorable crystallinity in proximities of the interface with the substrate, rapid heating is performed when the silicon film assumes a thickness of 10 nm by increasing the light quantity of the lamp 77. The heating condition is set that rapid heating is performed at a temperature rising speed of 40° C./sec up to 800° C., the temperature maintained at 800° C. for 10 seconds, and the temperature of the substrate is again decreased to 300° C. by controlling the power of the lamp.

Figure 9:
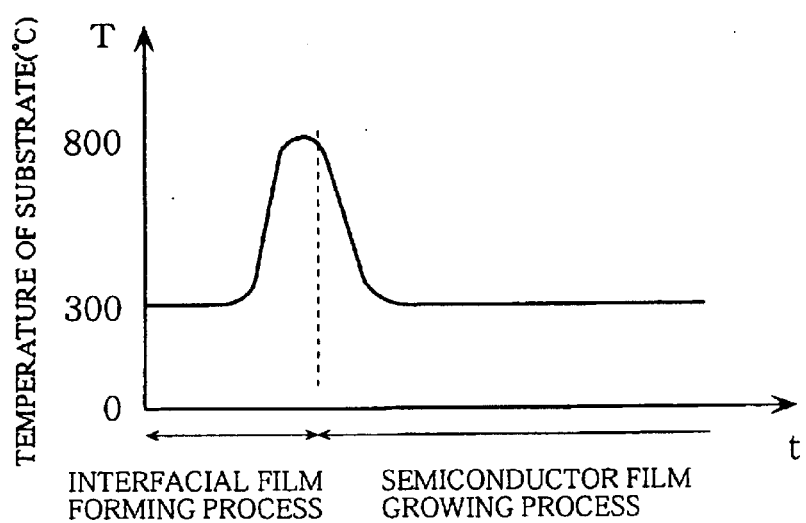
FIG. 9 is a graph showing time-varying changes of temperatures of a substrate.

Time-varying changes of the temperature of the substrate are illustrated in FIG. 9.

Optical energy is supplied to the silicon film through the rapid heating process such that hydrogen contained in the film is separated and bonding of silicon becomes firmer. With this arrangement, crystallinity of the film at the interface of the substrate is improved, and it is possible to obtain a silicon film exhibiting favorable crystallinity and having a low defect density in the following main body film forming process. As for conditions for the main body film forming process, film forming is performed with microwave plasma having a microwave electric power of 200 W by using monosilane ($SiH_4$) and hydrogen ($H_2$) gas as raw material gas. With these film forming conditions, it is possible to ignore ion collision damages applied to the film forming surface and a film of low defect density may be formed. The temperature of the substrate is set to 300° C. to obtain a crystalline silicon film having an overall width of 100 nm. The thus obtained film exhibits favorable crystallinity also at the interfacial portion of the substrate and a low defect density of the film growing portion.

Other Matters (1) While improvements in crystallinity have been achieved by performing rapid heating using a lamp of 800° C. during the interfacial film forming process, the heating temperature at this time is set to be higher than the temperature of the substrate during the film forming process and not more than 1,200° C., preferably to be not less than 600° C. and not more than 1,000° C. The higher the temperature is within this range, the quicker may effects be observed, while substrates of low melting points such as those made of glass will be deformed in case the temperature exceeds 1,000° C. However, a temperature of not more than 1,000° C. is a momentarily bearable temperature.

(2) In performing these processes with a temperature difference of approximately 300° C. at intervals within 100 seconds, it is desirable to set the temperature rising speed at the time of performing the interfacial film forming process to be at least 6° C./sec provided that the temperature rising/descending speeds are identical.

(3) While microwave plasma has been employed as plasma in the fourth embodiment, the present invention is not limited to this, and it is alternatively possible to employ plane-parallel type capacitive coupling plasma, helicon wave plasma, surface wave plasma or electron cyclotron resonance plasma. In case of employing plasma such as plane-parallel type capacitive coupling plasma, it is preferable to set the discharge frequency in a range of 20 MHz to 100 MHz whereby the ion collision energy can be decreased and the defect density decreased in the main body film forming process. As long as the electron temperature and the ion collision energy may be restricted to be low, the invention is not limited to these plasma generating methods, and it is possible to apply any suitable method to the method for manufacturing a semiconductor thin film or the manufacturing device thereof of the present invention.

(4) Employing a light-transmitting substrate such as one made of glass having a larger optical band gap than the silicon film is preferable since the silicon film may be selectively heated thereby. The lamp may be a halogen lamp, xenon lamp, deuteride lamp or an ultraviolet lamp, while it is desirable to employ a lamp with a large light quantity and a wavelength of not more than 300 nm for selectively heating the silicon film formed on the substrate.

(5) The raw material gas is not limited to monosilane ($SiH_4$) as employed in the above-described first embodiment, and it is alternatively possible to employ disilane ($Si_2H_6$), silane chloride ($SiH_2Cl_2$ etc), silane fluoride ($SiF_4$ etc) or monogermane ($GeH_4$). As for the dilution gas, it is also possible to employ rare gas such as argon, xenon or helium instead of hydrogen.

(6) Setting the temperature of the substrate at the time of forming the film in a range of 100 to 600° C. is favorable since it allow the usage of substrates of low costs such as those made of glass. It is more preferable to set the temperature of the substrate to not more than 450° C. since the manufacturing device may be made of aluminum. Further, setting the temperature of the substrate in a range of 100 to 350° C. is even more preferable since the film forming surface may be activated by an extend with which hydrogen contained in the film will not be parted so that a semiconductor film of high quality may be formed.

(7) Employing an arrangement in which a buffer layer is provided on the surface of the substrate is preferable since dispersion of impurities contained in the substrate into the semiconductor thin film may be prevented.

Fifth Embodiment

Figure 10:
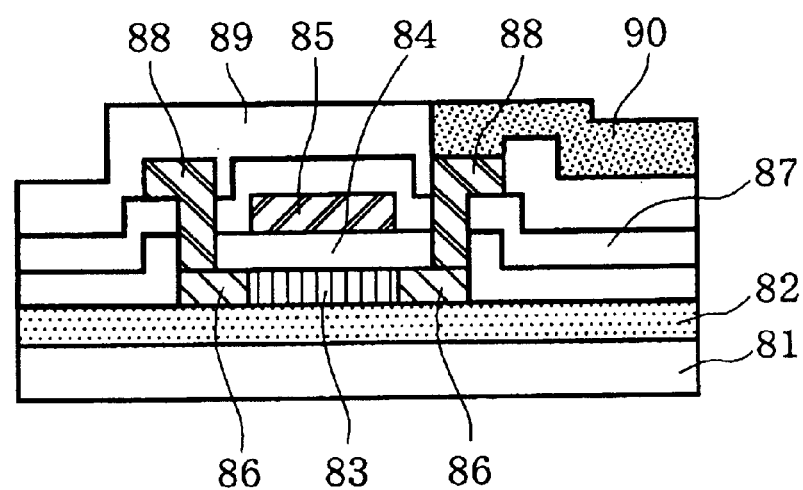
FIG. 10 is a sectional view showing a thin film transistor according to a fifth embodiment.

The fifth embodiment relates to a thin film transistor employing the semiconductor thin film of the present invention as an active layer and further to a liquid crystal display device employing the same. A method for manufacturing the thin film transistor of the present invention as illustrated in FIG. 10 will now be explained.

A silicon oxide film having a thickness of 200 nm is deposited as a buffer layer 82 on a surface of a substrate 81, and a polycrystalline silicon film 83 having a thickness of 150 nm is formed thereon through, for instance, the method for manufacturing a semiconductor thin film as illustrated in the first embodiment. By performing patterning thereof in an insular manner, an active layer having superior crystallinity, a smooth upper surface and a low defect density is formed.

After forming a silicon oxide film of 120 nm as a gate insulating film 84, a metallic film consisting of Ti, Mo, W, Al or Ta or the like is formed to assume a thickness of 200 nm, and by etching the metallic film using a photo resist of which patterning has been performed through photolithography as a mask, a gate electrode 85 is formed. It should be noted that the gate electrode 85 does not necessarily be of a metallic film but may also be of a silicon film.

Ion including an impurity is injected by using the gate electrode 85 as a mask, and an impurity doping layer that serves as a source/drain region is formed within the polycrystalline silicon film 83. Forming of the doping layer 86 is performed through ion doping by using hydrogen diluted 5% $PH_3$ as ion source gas in forming, for instance, an n-type layer. In case of forming a p-type layer, ion doping is performed by using hydrogen diluted 5% $B_2H_6$ as ion source gas. As for conditions for applying ion doping, a heating voltage is set to be 5 to 100 kV and a total amount of injecting ion is $10^{14}$ to $10^{16}$ cm$^{-2}$. Suitable conditions and gas densities are respectively selected in view of thicknesses of masks or thicknesses of doping layers to be formed.

A silicon oxide film that serves as an insulating film between layers 87 is formed to assume a thickness of 100 to 500 nm, and the silicon oxide film is opened through photolithography/etching for electrode contact with the source/drain region, and by forming a source/drain electrode 88, the thin film transistor is completed.

Setting the thickness of the active layer of the thin film transistor to be not less than 20 nm and not more than 500 nm is preferable since it is thereby possible to form a thin film transistor with a high ON current and a low OFF current. In case the thin film transistor is of top gate type, the insular active layer needs to be covered by a gate insulating film so that it is preferable to set the thickness of the active layer to be not less than 20 nm and not more than 200 nm.

Other Matters (1) While ion injection is performed in the present fifth embodiment by eliminating the silicon oxide film at a region to which injection is performed, it is alternatively possible to perform ion injection by remaining the silicon oxide film also on a surface of a region to which injection is performed. At this time, an acceleration voltage of the ion is preferably set to be not less than 10 kV, though being dependent on conditions such as film thicknesses.

(2) While the fifth embodiment illustrates an example of a method for manufacturing a thin film transistor of top gate type, it may alternatively be a thin film transistor of bottom gate type. Respective thin films comprising the thin film transistor of the present invention are not limited those as described in the embodiments as long as they exhibit the same functions. For instance, the insulating film does not necessarily be a silicon oxide film but may also be a silicon nitride film.

(3) By arranging a thin film transistor array in the thin film transistor of the present invention that is connected to a pixel electrode 90 comprised of a drain electrode and ITO or the like, the same may be applied to liquid crystal display devices of active matrix type.

Sixth Embodiment

Figure 11:
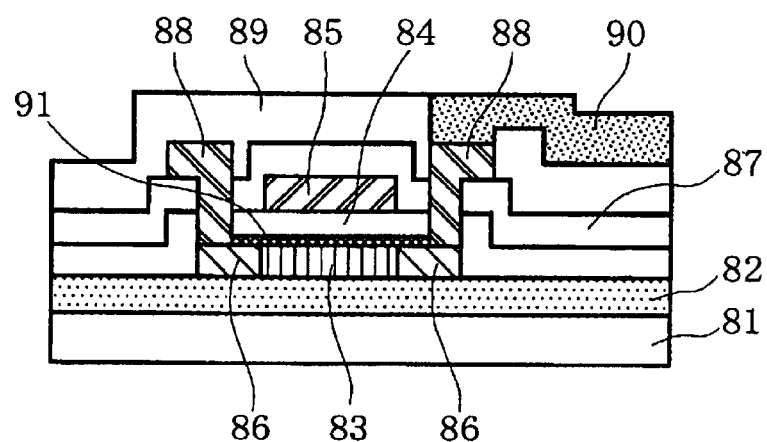
FIG. 11 is a sectional showing a thin film transistor according to a sixth embodiment.

The sixth embodiment relates to a thin film transistor and a liquid crystal display device employing the same in which an amount of intermixed oxygen impurities into the semiconductor thin film of the present invention is decreased. A method for manufacturing a thin film transistor of the present invention as illustrated in FIG. 11 will now be explained.

A silicon oxide film is deposited on a surface of a substrate 81 to assume a thickness of 200 nm as a buffer layer 82, and a polycrystalline silicon film 83 is formed thereon. The polycrystalline silicon film 83 may be formed, for instance, by using the method for manufacturing a semiconductor thin film as illustrated in the first embodiment. Upon forming the polycrystalline silicon film 83 to assume a thickness of 100 nm, a silicon nitride film is successively deposited thereafter without exposure to atmosphere through plasma CVD method, and a film containing no oxygen 91 is formed for protecting the surface of the polycrystalline silicon film 83 is formed. In the illustrated embodiment, the film containing no oxygen 91 is employed as a part of a gate insulating film. The polycrystalline silicon film that is formed through CVD method is of columnar structure that will be easily oxidized through exposure to atmosphere so that intermixing of oxygen impurities into the polycrystalline silicon film that will serve as the active layer is prevented by covering the surface by an oxidation-preventing film (which is a film containing no oxygen in its composition, and is a silicon nitride film in the present sixth embodiment). It should be noted that the oxidation-preventing film desirably includes a smaller amount of oxygen as an impurity than the polycrystalline silicon film does.

Thereafter, the polycrystalline silicon film 83 and the film containing no oxygen 91 are processes in an insular manner through photolithography/etching, and a silicon oxide film having a thickness of 120 nm is formed through plasma CVD method or the like as the gate insulating film 84. A metallic film consisting of Ti, Mo, W, Al or Ta or the like is formed to assume a thickness of 200 nm, and by etching the metallic film using a photo resist of which patterning has been performed through photolithography as a mask, a gate electrode 85 is formed. It should be noted that the gate electrode 85 does not necessarily be of a metallic film but may also be of a silicon film.

Ion including an impurity is injected by using the gate electrode 85 as a mask, and an impurity doping layer that serves as a source/drain region is formed within the polycrystalline silicon film. Forming of the doping layer 86 is performed through ion doping by using hydrogen diluted 5% $PH_3$ as ion source gas in forming, for instance, an n-type layer. In case of forming a p-type layer, ion doping is performed by using hydrogen diluted 5% $B_2H_6$ as ion source gas. As for conditions for applying ion doping, a heating voltage is set to be 5 to 100 kV and a total amount of injecting ion is $10^{14}$ to $10^{16}$ cm$^{-2}$. Suitable conditions and gas densities are respectively selected in view of thicknesses of masks or thicknesses of doping layers to be formed.

A silicon oxide film that serves as an insulating film between layers 87 is formed to assume a thickness of 100 to 500 nm, and the silicon oxide film is opened through photolithography/etching for electrode contact with the source/drain region, and by forming a source/drain electrode 88, the thin film transistor is completed.

Setting the thickness of the active layer of the thin film transistor to be not less than 20 nm and not more than 500 nm is preferable since it is thereby possible to form a thin film transistor with a high ON current and a low OFF current. In case the thin film transistor is of top gate type, the insular active layer needs to be covered by a gate insulating film so that it is preferable to set the thickness of the active layer to be not less than 20 nm and not more than 200 nm.

By arranging a thin film transistor array in the thin film transistor of the present invention that is connected to a pixel electrode 90 comprised of a drain electrode and ITO or the like, the same may be applied to liquid crystal display devices of active matrix type.

Other Matters (1) While the sixth embodiment illustrates an example of a method for manufacturing a thin film transistor of top gate type, it may alternatively be a thin film transistor of bottom gate type.

(2) While ion injection is performed in the present sixth embodiment by eliminating the silicon oxide film at a region to which injection is performed, it is alternatively possible to perform ion injection by remaining the silicon oxide film also on a surface of a region to which injection is performed. At this time, an acceleration voltage of the ion is preferably set to be not less than 10 kV, though being dependent on conditions such as film thicknesses.

(3) Respective thin films comprising the thin film transistor of the present invention are not limited those as described in the embodiments as long as they exhibit the same functions. For instance, the insulating film does not necessarily be a silicon oxide film but may also be a silicon nitride film.

(4) It is preferable to employ a silicon nitride film as the film containing no oxygen 91, since it exhibits high pressure resistance of insulation and may be used as a part of the gate insulating film. However, the same effects as those of the present invention may be achieved as long as the amount of oxygen contained in the film containing no oxygen is less than that of the polycrystalline silicon film 83. Its function is further not necessarily limited to the usage as a part of the gate insulating film but may also be used as a part of the protecting film or the active layer.

(5) While the semiconductor thin film that is used as the active layer is formed through plasma CVD method in the sixth embodiment, the present invention is not limited to this method as long as it is possible to directly obtain a crystalline semiconductor thin film at low temperature.

Seventh Embodiment

Figure 12:
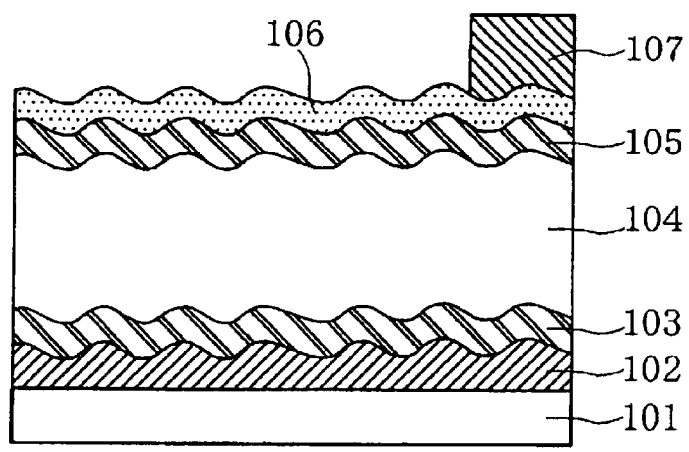
FIG. 12 is a sectional view showing a thin film solar cell employing a polycrystalline silicon film as a photoelectric converting layer.

The seventh embodiment relates to a thin film solar cell and a method for manufacturing the same employing the polycrystalline silicon film of the present invention as a photoelectric converting layer as illustrated in FIG. 12.

A metallic film 102 is formed on a substrate 101 through spattering or the like. At this time, it is preferable that the surface of the metallic film includes concaves and convexes whereby photoelectric converting efficiencies may be improved owing to confinement effects of solar light. Thereafter, a p-layer 103 comprised of low-resistant silicon film exhibiting p-type conduction properties, an i-layer 104 comprised of a polycrystalline silicon film of which no control of conduction is performed, and an n-layer 105 comprised of a low-resistant silicon film exhibiting n-type conduction properties are formed through plasma CVD method or the like.

The i-layer 104 is a polycrystalline film of columnar arrangement that is easily oxidized, and the i-layer 104 and the n-layer 105 are successively formed in a vacuum condition without exposure to atmosphere. In case the n-layer 105 is a polycrystalline film of columnar structure, oxidation of the film will progress after forming the n-layer 105, so that it is preferable that the n-layer 105 be a layer that is not a polycrystalline film of columnar structure, but for instance, an amorphous silicon film. As a film forming condition for the n-layer 105, in case the temperature of the substrate is higher than that at time of forming the i-layer 104, hydrogen contained in the i-layer 104 will be separated to increase defects, and it is thus desirable to set the temperature of the substrate at the time of forming the n-layer 105 to be not more than the temperature of the substrate at the time of forming the i-layer 104.

A transparent electrode 106 such as ITO or the like is formed thereafter and a terminal 107 made of gold or the like is formed for completing the solar cell.

Other Matters

While the seventh embodiment has been explained with reference to an embodiment of a solar cell of pin type, the same effects as those of the present invention may be achieved by successively forming the i-layer and overlying films even if it is of nip type or of multi-junction type.

What is claimed is:

1. A method for manufacturing a thin film transistor employing a crystalline semiconductor thin film of columnar arrangement that has been manufactured through plasma resolution of raw gas material as an active layer, wherein an upper surface of the semiconductor thin film is smoothed by controlling ion collision energy at the time of depositing the semiconductor thin film through plasma CVD method.

2. The method for manufacturing a semiconductor thin film according to claim 1, wherein laser annealing of the semiconductor thin film is performed.

* * * * *